United States Patent [19]
Kim

[11] Patent Number: 5,997,656
[45] Date of Patent: Dec. 7, 1999

[54] SEMICONDUCTOR WET PROCESSING EQUIPMENT HAVING INTEGRATED INPUT AND EMERGENCY OUTPUT PORT UNITS AND A METHOD OF CONTROLLING THE LOADING AND UNLOADING OF LOTS IN THE SAME

[75] Inventor: Seok-hyun Kim, Seoul, Rep. of Korea

[73] Assignee: Samsung Electronics Co., Ltd., Suwon, Rep. of Korea

[21] Appl. No.: 09/184,849

[22] Filed: Nov. 3, 1998

[30] Foreign Application Priority Data

Feb. 3, 1998 [KR] Rep. of Korea ......................... 98- 2893

[51] Int. Cl.$^6$ ........................................................ B08B 3/02
[52] U.S. Cl. .............................. 134/18; 134/25.4; 134/61; 134/902
[58] Field of Search ............................... 134/61, 902, 113, 134/115, 25.4, 18

[56] References Cited

U.S. PATENT DOCUMENTS

| | | | |
|---|---|---|---|
| 4,739,780 | 4/1988 | Czaja | 134/61 |
| 5,370,142 | 12/1994 | Nishi | 134/61 |
| 5,431,179 | 7/1995 | Miyazaki | 134/61 |
| 5,445,171 | 8/1995 | Ohmori | 134/61 |
| 5,568,821 | 10/1996 | Ohmori | 134/61 |
| 5,701,627 | 12/1997 | Matsumura | 15/88.2 |
| 5,862,823 | 1/1999 | Kamikawa | 134/182 |

*Primary Examiner*—Frankie L. Stinson
*Attorney, Agent, or Firm*—Jones Volentine, LLP

[57] ABSTRACT

Wet processing equipment automatically and rapidly unloads unit lots of semiconductor devices at an input port unit without any intervention of an operator in the event of an emergency, and thereby prevents unforeseen operational problems. The semiconductor wet processing equipment includes an emergency output port unit integral with the input port unit. The emergency output port unit will transfer lots directly from the loading position established by the input port unit and set the lots at an emergency unloading position when a predetermined condition occurs in the wet processing equipment. When such a condition occurs, a process canceling command is input from a host computer. If the process canceling command is input, the controller determines whether the lot is in a standby state at the loading position. If the lot is in the standby state, the process canceling command is downloaded into the processing equipment. Then a determination is made as to whether the lot has been unloaded from the input port unit onto the emergency output port unit. If the lot has been unloaded from the input port unit onto the emergency output port unit, an AGV operating command is downloaded into an AGV server.

6 Claims, 3 Drawing Sheets

SEMICONDUCTOR WET PROCESSING EQUIPMENT HAVING INTEGRATED INPUT AND EMERGENCY OUTPUT PORT UNITS AND A METHOD OF CONTROLLING THE LOADING AND UNLOADING OF LOTS IN THE SAME

BACKGROUND OF THE INVENTION

1. Field of the Invention

The present invention relates to semiconductor wet processing equipment and to a method of loading lots of semiconductor wafers onto and unloading the lots from the semiconductor wet processing equipment. More particularly, the present invention relates to semiconductor wet processing equipment capable of automatically unloading lots of semiconductor wafers in the event of an emergency.

2. Description of the Related Art

Generally speaking, fabricating semiconductor devices requires a highly precise execution of numerous manufacturing processes. Highly functional pieces of semiconductor fabrication equipment including, e.g., wet processing equipment, are arranged along a semiconductor fabrication line to perform these highly precise processes.

The elaborate operations of the equipment are monitored by an operator through a control system that is also provided on the semiconductor fabrication line. The operator uses the information provided by the control system to enhance the operation efficiency of the processing equipment.

FIG. 1 shows wet processing equipment 100 for performing a wet semiconductor manufacturing process. Lots 1 of semiconductor wafers, loaded in cassettes 3 traveling along the semiconductor fabrication line, are loaded onto the wet processing equipment 100 so that the wafers can be processed.

At this time, the operator monitors the operating state of the wet processing equipment 100 through an operator interface personal computer (O/I PC) 7 that is connected to the wet processing equipment 100. The wet processing equipment 100 is, in turn, connected to a host computer 6 by an equipment server 5. The host computer 6 is thus on-line with the O/I PC 7.

When the operator inputs basic fabrication data, e.g., the ID (identification) of a lot 1 to be processed and the ID of the wet processing equipment 100 for processing the wafers of lot 1, into the host computer 6 through the O/I PC 7, the host computer 6 searches its database for appropriate wet process condition data. Thereafter, the operator checks the wet process condition data and inputs a process commencing command or a process terminating command. Depending on the command, the lot 1 is rapidly tracked in or out of the wet processing equipment 100.

An input port unit 10 and an output port unit 20 are respectively provided at opposite ends of a body 30 of the wet processing equipment 100. The input port unit 10 and the output port unit 20 provide a loading position A and an unloading position B at which the lot 1 is loaded onto the wet processing equipment 100 and is unloaded therefrom, respectively. When a loading cassette 3 is loaded onto an input port table 11 by an auto-guided vehicle (AGV) under the control of an AGV server 8, a loading arm 13 received in a loading slit 12 formed in the input port unit 10 handles the cassette 3 and moves the cassette 3 to the loading position A. The wafers contained in the loading cassette 3 can be accurately introduced from this position into a wet process bath 31 by a robot arm 2, the wafers being processed rapidly in the wet process bath 31.

In addition, an unloading arm 23, received in an unloading slit 22 formed in an output port table 21 of the output port unit 20, handles an unloading cassette 4. Wafers are carried out from the wet process bath 31 and are placed in the unloading cassette 4. The unloading arm 23 places the unloading cassette 4 at an unloading position B on the output port desk 21, from which position the lot 1 can be rapidly unloaded from the wet processing equipment 100 by the AGV.

However, such conventional semiconductor wet processing equipment has several problems.

First, in the event of an emergency, such as an error in a process condition detected by the operator while the lot is waiting at the loading position of the input port unit, the lot should be rapidly unloaded from the processing equipment. At this time, however, the output port unit is disposed far away from the input port unit. As a result, it is impossible to rapidly unload the lot.

Therefore, the lot must be unloaded by hand. However, a large amount of manual labor and time is required to unload the lot waiting at the loading position of the input port unit.

Furthermore, a lot that is manually unloaded from the input port unit may collide with a lot that is being automatically loaded onto the processing equipment at the loading position. Operational problems may occur due to such a collision of the lots.

SUMMARY OF THE INVENTION

It is therefore an object of the present invention to provide wet processing equipment in which lots at an input port unit can be automatically and rapidly unloaded without any intervention of an operator in the event of an emergency, and thereby prevent unforeseen operational problems.

To achieve this and other objects, the semiconductor wet processing equipment according to the present invention includes an emergency output port unit integral with the input port unit. The emergency output port unit will transfer lots directly from the loading position established by the input port unit and set the lots at an emergency unloading position when a predetermined condition occurs in the wet processing equipment.

The input port unit preferably comprises an input port table having a loading slit extending therein along a loading path, and a loading arm received in the loading slit so as to be slidable relative to the input port table.

In this case, the emergency output port unit preferably comprises first and second emergency unloading arms, and an emergency output port table having at least one first emergency unloading slit and a second emergency unloading slit therein. The first emergency unloading slit extends perpendicular to and is open to the loading slit of the input port unit, whereas the second emergency unloading slit extends perpendicular to and is open to each first emergency unloading slit. A first emergency unloading arm is received in each first emergency unloading slit so as to be slidable relative to the emergency port table from the loading slit of the input port unit to the second emergency unloading slit. On the other hand, the second emergency unloading arm is received in the second emergency unloading slit so as to be slidable relative to the emergency port table from the first emergency unloading slit to the emergency unloading position.

It is another object of the present invention to provide a method of controlling the loading of lots of semiconductor wafers onto and the unloading of lots from semiconductor processing equipment, in such a manner that the lots can be automatically and rapidly unloaded without any intervention of an operator in the event of an emergency.

To achieve this and other objects of the present inanition, the method comprises the steps of: determining whether a process canceling command is input from a host computer; if the process canceling command is input, determining whether the lot is in a standby state; if the lot is in the standby state, downloading the process canceling command into the processing equipment; determining whether the lot has been unloaded from the input port unit onto the emergency output port unit; and if the lot has been unloaded from the input port unit onto the emergency output port unit, downloading an AGV operating command into an AGV server.

Preferably, if the process canceling command is not input, the controlling method also includes the steps of downloading a process commencing command into the processing equipment to load the lot into the processing equipment; and processing the lot in the equipment.

Therefore, in the event of an emergency, a lot waiting at the input port unit can be rapidly unloaded without any intervention of the operator.

BRIEF DESCRIPTION OF THE DRAWINGS

The above and other objects, features and advantages of the present invention will become more apparent from the following detailed description of the preferred embodiments thereof made with reference to the accompanying drawings, of which.

DETAILED DESCRIPTION OF THE PREFERRED EMBODIMENTS

Figure 1:
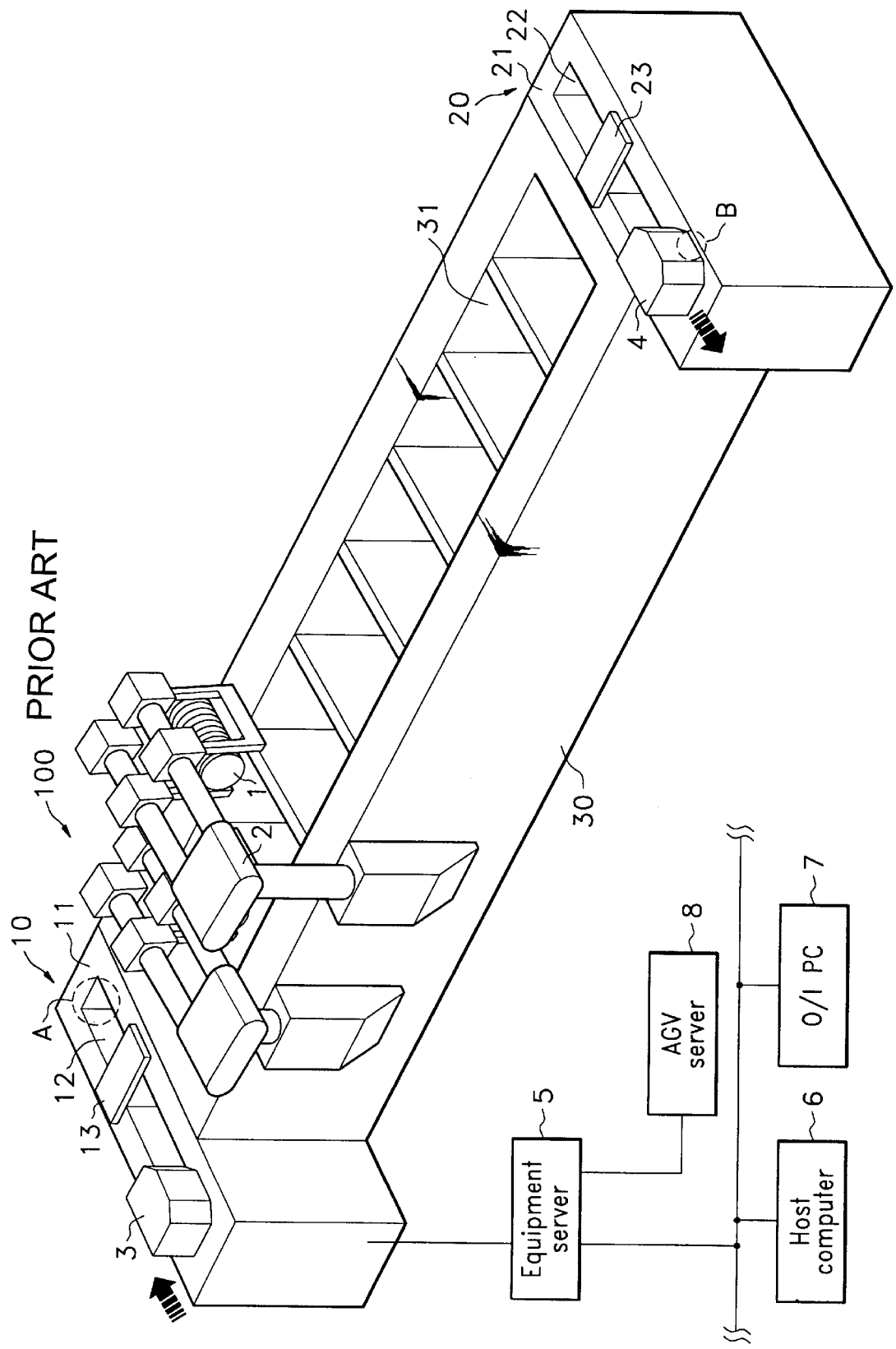
FIG. 1 is a schematic diagram of conventional semiconductor wet processing equipment.
Figure 2:
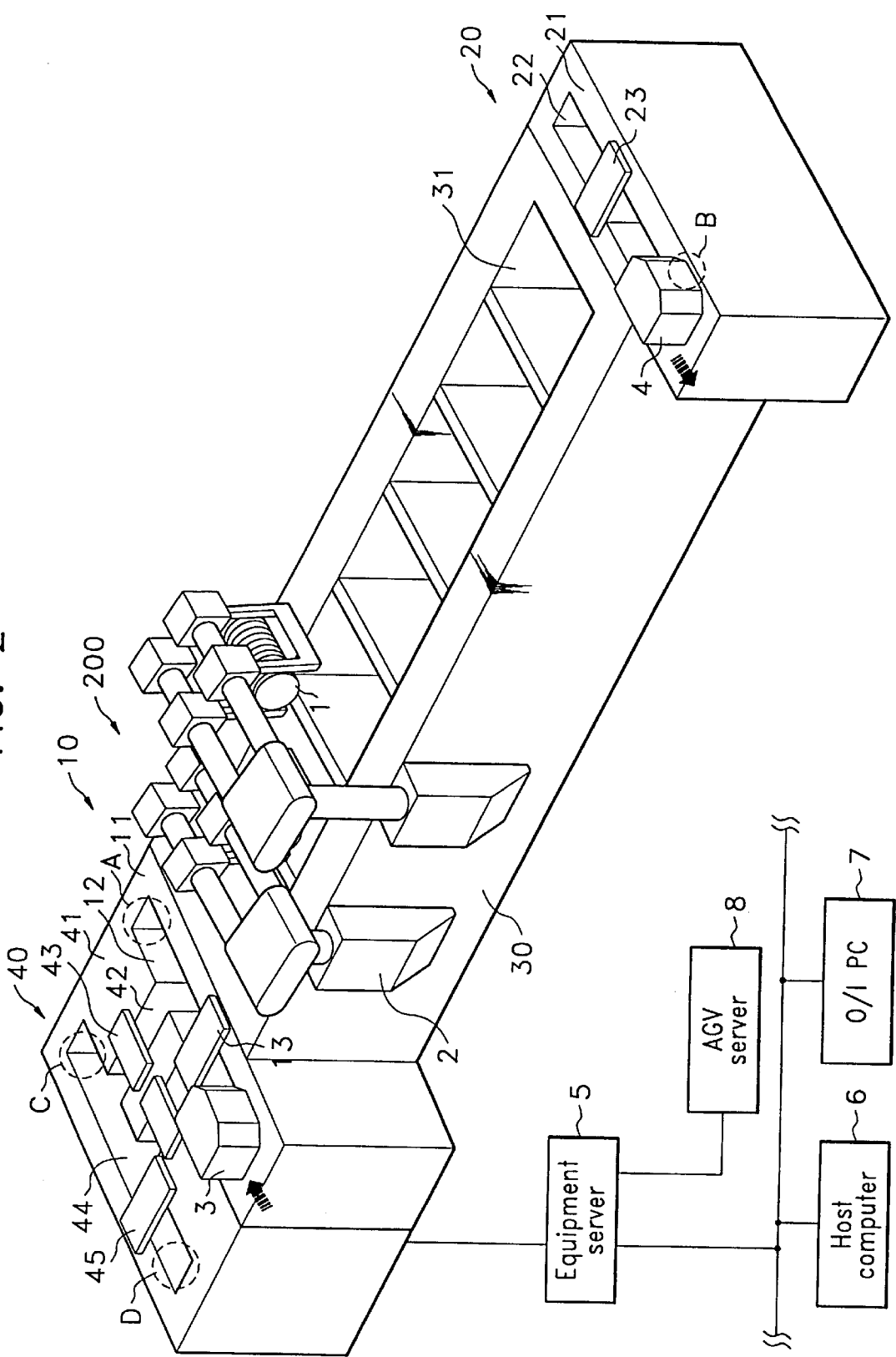
FIG. 2 is a schematic diagram of semiconductor wet processing equipment according to the present invention.

Referring first to FIG. 2, the wet processing equipment 200 of the present invention comprises a body 30 providing a plurality of wet process baths 31, an input port unit 10 disposed at one end of the body 30 for positioning a lot 1 loaded thereon at a loading position A from which the lot 1 can be accurately introduced into the wet baths 31, an output port unit 20 disposed at the other end of the body 30 for positioning the lot 1 after having been processed in the wet baths 31 at an unloading position B from which position the lot 1 can be unloaded, and an emergency output port unit 40 integrated with the input port unit 10.

The emergency output port unit 40 unloads the lot 1 from the loading position A and places the lot 1 at either one of first and second emergency unloading positions C and D when a predetermined condition arises, e.g., when a process canceling command is issued by the operator in an emergency situation. This predetermined condition will be described in more detail later on.

The emergency output port unit 40 includes an emergency output port table 41, at least one first emergency unloading slit 42 extending in the emergency output port table 41 from and perpendicular to the loading slit 12 of the input port unit 10, a respective first emergency unloading arm 43 received in each first emergency unloading slit 42 for transferring the lot 1 from the loading position A to the first emergency unloading position C, a second emergency unloading slit 44 extending in the emergency output port table 41 from and perpendicular to the first emergency unloading slit(s) 42, and a second emergency unloading arm 45 received in the second emergency unloading slit 44 for transferring the lot 1 from the first emergency unloading position C to the second emergency unloading position D.

Figure 3:
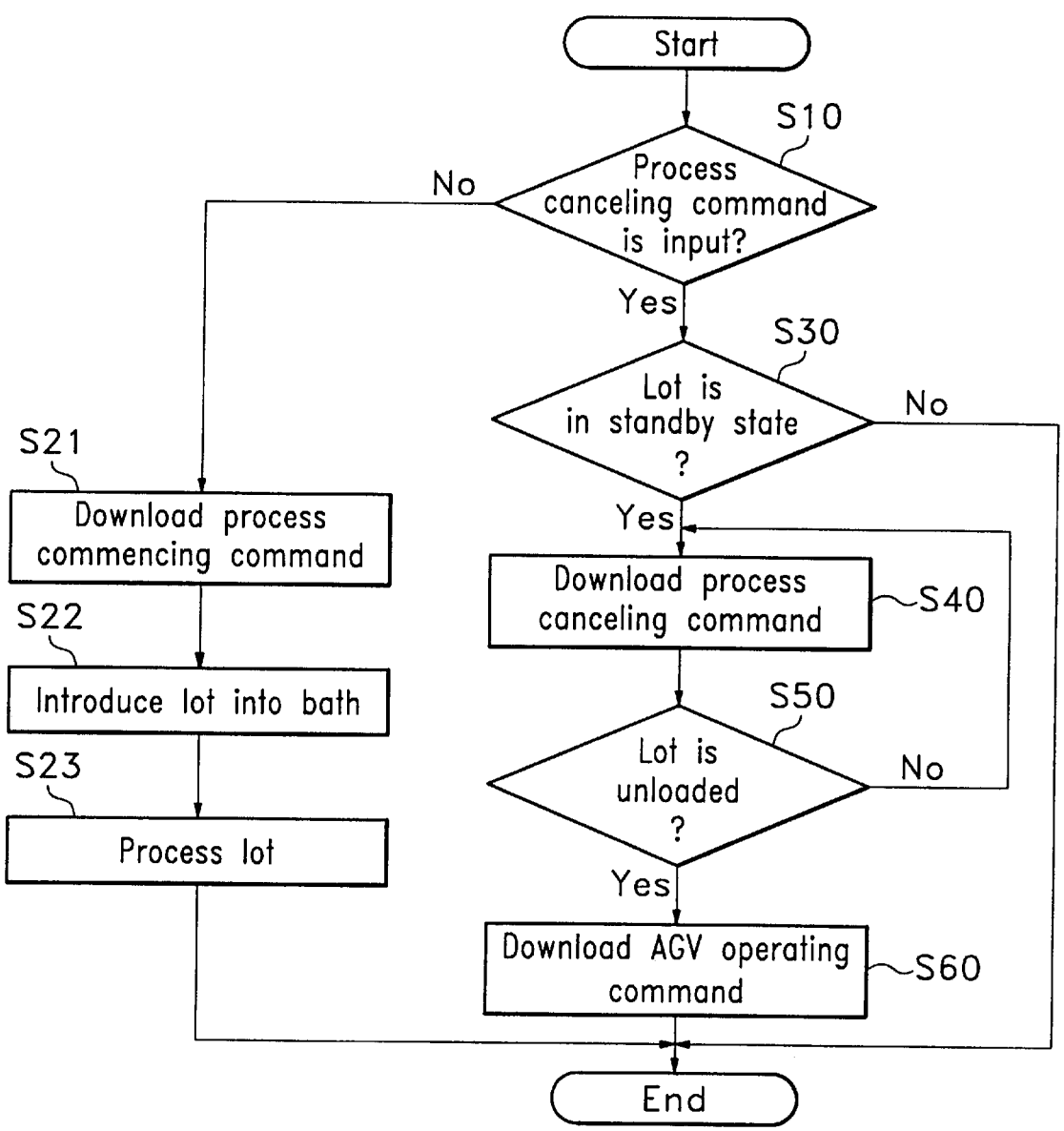
FIG. 3 is a flow chart of a method of loading lots onto and unloading lots from the semiconductor wet processing equipment according to the present invention.

When a loading cassette 3 is placed at the loading position A by the loading arm 13, the operator checks the process condition data called up by a host computer 6 through an O/I PC 7 and determines whether the values of the process condition data are appropriate. Based on this determination, the operator inputs a process commencing command or a process canceling command to an equipment server 5. The equipment server 5 then determines whether the process canceling command has been input via the O/I PC 7 (step S10) as shown in FIG. 3.

If the process canceling command was not inputted, the equipment server 5 recognizes the fact that the operator approved the process condition data of the host computer 6 and downloads the process commencing command into the wet processing equipment 200 (step S21).

The process commencing command causes the robot arm 2 to transfer the lot 1 from the loading cassette 3, located at the loading position A, into the wet process bath 31 (step S22). The lot 1 is rapidly processed in the wet process bath 31 according to the wet process condition data (step S23). Thereafter, the unloading arm 23 positions the unloading cassette 4 containing the processed lot 1 at the unloading position B so that the lot 1 can be rapidly unloaded from the wet process equipment 200 by the AGV.

On the other hand, if the process canceling command is input, the equipment server 5 recognizes that an emergency exists and the operator does not approve of the wet process condition data. Thereafter, the equipment server 5 determines whether the lot 1 is waiting at the loading position A (step S30).

If the lot 1 is not waiting at the loading position A and has been already run, the equipment server 5 recognizes the fact that it is too late to unload the lot 1 through the emergency output port unit 40. The equipment server 5 then terminates its control of the emergency output port unit 40. In this case, the lot 1 which has been wet processed should be manually unloaded by the operator in the same manner as previously described in connection with the conventional art.

If, on the other hand, the lot 1 is waiting at the loading position A, the equipment server 5 determines that the lot 1 should be unloaded via the emergency output port unit 40 and downloads the process canceling command input from the O/I PC 7 to the wet processing equipment 200 (step S40).

As a result of the issuance of the process canceling command, the first emergency unloading arm 43 is controlled to transfer the loading cassette 3 from the loading position A to the first emergency unloading position C. Then, the second emergency unloading arm 45 is controlled to transfer the loading cassette 3 from the first emergency unloading position C to the second emergency unloading position D so that the lot 1 can be safely unloaded by the AGV. Thereafter, the equipment server 5 receives event data from the wet processing equipment 200 and determines whether the lot 1 has been successfully transferred from the loading position A to the second emergency unloading position D (step S50).

If it is determined that the lot 1 has not been successfully transferred from the loading position A to the second emergency unloading position D, the equipment server 5 considers that there has been a communication error with the wet processing equipment 200 and downloads the process canceling command again (step S40). The process canceling command downloading step is repeatedly performed.

However, if it is determined that the lot 1 has been successfully transferred from the loading position A to the second emergency unloading position D, the equipment server 5 considers the emergency unloading of the lot 1 to be complete and downloads an AGV operating command into the AGV server 8 so that the lot 1 will be carried out of the wet processing equipment 200 (step S60). As a result of this issuance of the AGV operating command, the AGV server 8 controls the AGV to carry the lot 1 out of the equipment from the second emergency unloading position D.

Thereafter, the equipment server 5 repeatedly performs the above steps, whereby the loading and unloading of the lots 1 onto and from the wet processing equipment 200 is efficiently controlled.

Although the present invention has been described above with reference to the preferred embodiments thereof, many alternatives, modifications and variations thereof will be apparent to those of ordinary skill in the art. For instance, it should be noted that the present invention is not limited to wet processing equipment and can be applied to any type of semiconductor fabricating equipment having an input port unit and an output port unit at opposite ends of the main processing portion of the equipment. Accordingly, all such alternatives, modifications and variations are seen to be within the true spirit and scope of the invention as defined by the appended claims.

What is claimed is:

1. Semiconductor processing equipment comprising:

a body defining at least one processing station;

an input port unit disposed at one end of said body, said input port unit including a loading arm movable along a loading path extending between a first position and a loading position so as to receive a lot of wafers to be processed and transfer the lot to the loading position where the lot can be introduced into the at least one processing station;

an emergency output port unit integrated with said input port unit, said emergency output port unit including at least one emergency unloading arm movable along a path extending between said input port unit and an emergency unloading position, whereby the lot of wafers can be unloaded directly from said input port unit in an emergency; and an output port unit disposed at the other end of said body, said output port unit including an unloading arm movable along an unloading path extending between an outlet of said at least one processing station and an unloading position so as to receive the lot from said at least one processing station and transfer the lot to said unloading position where the lot can be unloaded from the processing equipment.

2. The semiconductor processing equipment according to claim 1, wherein said input port unit further comprises an input port table having a loading slit extending therein along said loading path, said loading arm being received in said loading slit so as to be slidable relative to said input port table, and said emergency output port unit further comprises an emergency output port table having at least one first emergency unloading slit and a second emergency unloading slit therein, said first emergency unloading slit extending perpendicular to and being open to said loading slit of said input port unit, said second emergency unloading slit extending perpendicular to and being open to each said first emergency unloading slit, and wherein said at least one emergency unloading arm comprises a respective first emergency unloading arm received in each said first emergency unloading slit so as to be slidable relative to said emergency port table from said loading slit to said second emergency unloading slit, and a second emergency unloading arm received in said second emergency unloading slit so as to be slidable relative to said emergency port table from said first emergency unloading slit to the emergency unloading position.

3. The semiconductor processing equipment according to claim 2, wherein said emergency output port table has two first emergency unloading slits therein extending perpendicular to and being open to said loading slit of said input port unit, and said second emergency unloading slit extending between first and second emergency positions, said second emergency unloading arm being slidable relative to said emergency port table between each of said first emergency unloading slits to a respective one of said emergency positions.

4. The semiconductor processing equipment according to claim 1, wherein said at least one processing station comprises a plurality of wet chemical baths.

5. A method of controlling loading lots of semiconductor wafers onto and unloading lots from semiconductor processing equipment, said method comprising:

determining whether a process canceling command has been input from a host computer;

if it is determined that said process canceling command has been input, determining whether a lot is waiting at an input port unit of the processing equipment;

if it is determined that the lot is waiting at said input port unit, downloading said process canceling command to the processing equipment;

determining whether the lot has been unloaded from the input port unit onto an emergency output port unit; and if it is determined that the lot has been unloaded from the input port unit onto the emergency output port unit, downloading an auto-guided vehicle operating command to a server of an auto-guided vehicle.

6. The method according to claim 5, and further comprising the step of: if said process canceling command has not been input, downloading a process commencing command to the processing equipment, and transferring the lot into the processing equipment to process the lot.

\* \* \* \* \*